(12) United States Patent
Phare et al.

(10) Patent No.: US 11,863,206 B2
(45) Date of Patent: Jan. 2, 2024

(54) OPTICAL PHASED ARRAY DRIVER

(71) Applicant: Voyant Photonics, Inc., New York, NY (US)

(72) Inventors: Christopher T. Phare, New York, NY (US); Lawrence Dah Ching Tzuang, New York, NY (US)

(73) Assignee: Voyant Photonics, Inc., New York, NY (US)

( * ) Notice: Subject to any disclaimer, the term of this patent is extended or adjusted under 35 U.S.C. 154(b) by 331 days.

(21) Appl. No.: 17/375,762

(22) Filed: Jul. 14, 2021

(65) Prior Publication Data

US 2022/0021398 A1 Jan. 20, 2022

Related U.S. Application Data

(60) Provisional application No. 62/705,770, filed on Jul. 15, 2020.

(51) Int. Cl.
*H03M 1/66* (2006.01)
*H03M 7/00* (2006.01)
*G02B 6/12* (2006.01)

(52) U.S. Cl.
CPC ........ *H03M 7/008* (2013.01); *G02B 6/12009* (2013.01); *H03M 1/66* (2013.01); *G02B 2006/12164* (2013.01)

(58) Field of Classification Search
CPC .. H03M 1/1009; H03M 1/1071; H03M 1/742; H03M 1/785; H03M 7/008; G01S 7/4817; G01S 13/4463; G01S 17/36; G01S 7/4815; G01S 7/4915; G01S 7/495

USPC .......... 341/144, 118–121, 31, 137
See application file for complete search history.

(56) References Cited

U.S. PATENT DOCUMENTS

| | | | | |
|---|---|---|---|---|
| 8,316,073 | B1 * | 11/2012 | Stevens | G06E 1/00 708/835 |
| 9,104,086 | B1 | 8/2015 | Davids et al. | |
| 9,325,419 | B1 * | 4/2016 | Kato | H04B 10/506 |
| 9,740,079 | B1 | 8/2017 | Davids et al. | |
| 9,871,528 | B1 * | 1/2018 | Kumar | H03M 1/742 |
| 2005/0073347 | A1 * | 4/2005 | Trosa | H03K 17/002 327/234 |
| 2005/0264472 | A1 * | 12/2005 | Rast | G09G 3/14 345/30 |

(Continued)

OTHER PUBLICATIONS

International Search Report and Written Opinion for corresponding PCT International Application No. PCT/US2021/041653, dated Oct. 26, 2021.

*Primary Examiner* — Linh V Nguyen
(74) *Attorney, Agent, or Firm* — Stratford Group Ltd.

(57) ABSTRACT

An optical phased array comprising a row-column driving mechanism is disclosed that reduces the number of digital to analog converter (DAC) channels to the number of rows N and the total number of interface pin counts down to the number of columns plus the number of rows M+N. Disclosed herein are systems and architecture for thermal waveguide-based phase shifters which improve thermal efficiency by having multi-pass waveguides arranged proximate a heating element in a serpentine fashion, which enables an increase in phase shift without increasing the length or the power consumption of the heating element by increasing the total length of waveguide being heated by a singular heating element.

22 Claims, 13 Drawing Sheets

(56) References Cited

U.S. PATENT DOCUMENTS

| | | | |
|---|---|---|---|
| 2016/0334648 A1 | 11/2016 | Lu et al. | |
| 2017/0276969 A1 | 9/2017 | Goodwill et al. | |
| 2018/0039154 A1* | 2/2018 | Hashemi | G02F 1/2955 |
| 2018/0292680 A1 | 10/2018 | Baehr-Jones et al. | |
| 2019/0056499 A1* | 2/2019 | Fatemi | G11C 8/04 |
| 2019/0356394 A1* | 11/2019 | Bunandar | H04B 10/548 |
| 2020/0026993 A1* | 1/2020 | Otsuka | H03M 1/66 |
| 2020/0110992 A1* | 4/2020 | Hosseinzadeh | G06N 3/045 |
| 2020/0393543 A1* | 12/2020 | David | H01S 5/0428 |
| 2021/0201126 A1* | 7/2021 | Meng | G02F 3/00 |

\* cited by examiner

OPTICAL PHASED ARRAY DRIVER

CROSS REFERENCE TO RELATED APPLICATIONS

This application claims priority to U.S. patent application Ser. No. 62/705,770, filed on Jul. 15, 2020, the entire content of which is herein incorporated by reference.

TECHNICAL FIELD

The present disclosure relates to thermal optical phase shifters for use in integrated photonics, and in particular to a driver for an array of thermal optical phase shifters.

BACKGROUND

Phase shifters are often used to shift the phase of light propagating through a waveguide. A thermal phase shifter, also referred to as a thermo-optic phase shifter, may be used to shift the phase of light in a waveguide by heating the waveguide, thereby changing the refractive index of the waveguide in a heated area via the thermo-optic effect. Any light propagating through the heated area with the slightly-changed index value travels at a different phase velocity, creating a net phase shift after some propagation length. In this manner, thermal phase shifters may be used to control switching, attenuation, or modulation of an optical signal.

Achieving both high resolution, large aperture, and large field-of-view (FOV) in optical phased arrays (OPA) requires a large number of phase shifters operating at the same time. Conventionally, this is done by brute-forced control of each individual phase shifter with an independent analog drive channel. However, this approach is difficult to scale to very large phase shifter arrays, as the number of independent channels becomes too great to manage: 1) too many independent metal traces that need to be wired to the outside of the photonics chip, and 2) too many independent analog-to-digital converter (DAC) channels that drives up the cost and complicates the control.

An object of the present invention is to overcome the shortcomings of the prior art by providing a more efficient driver for an optical phase array.

SUMMARY OF THE INVENTION

Accordingly, the present invention relates to an optical phased array device comprising:
an array of optical phase shifters comprising a plurality of rows of optical phase shifters, and a plurality of columns of optical phase shifters;
a plurality of digital to analog converters (DACs), each one of the plurality of DACs configured to output an independent voltage or current onto one of the plurality of rows of optical phase shifters;
a plurality of ground buses, each one of the plurality of ground buses configured to connect one of the plurality of columns of optical phase shifters to a common ground;
a multiplexer configured to selectively connect one of the plurality of ground buses to the common ground, while disconnecting others of the plurality of ground buses;
a processor; and
a non-transitory memory for storing instructions, which when for executed by the processor:
sequentially selects a different one of the plurality of columns of optical phase shifters to connect to the common ground, while disconnecting any other of the plurality of ground buses; and
updates the voltage or current for each of the plurality of DACs based on which one of the plurality of columns of optical phase shifters has been selected.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

It should be noted that, for many practical applications of integrated photonics, especially for optical phased arrays, a large number of phase shifters must be densely packed on the chip. When multiple phase shifters are used, the phase shifters must be spaced far enough apart to prevent thermal crosstalk, where one heater will change the phase of light travelling through neighboring phase shifters because the lateral spread of heat warms those waveguides as well. If the phase shifters are arrayed in a straightforward one-dimensional array (array unit vector perpendicular to the light propagation direction), they must be separated by over about 15 µm to ensure less than 10% crosstalk. Conventional configurations are also very awkwardly shaped for large arrays, as a 1024-phase-shifter array would occupy a rectangle of approximately 500 µm×16 mm.

Figure 1:
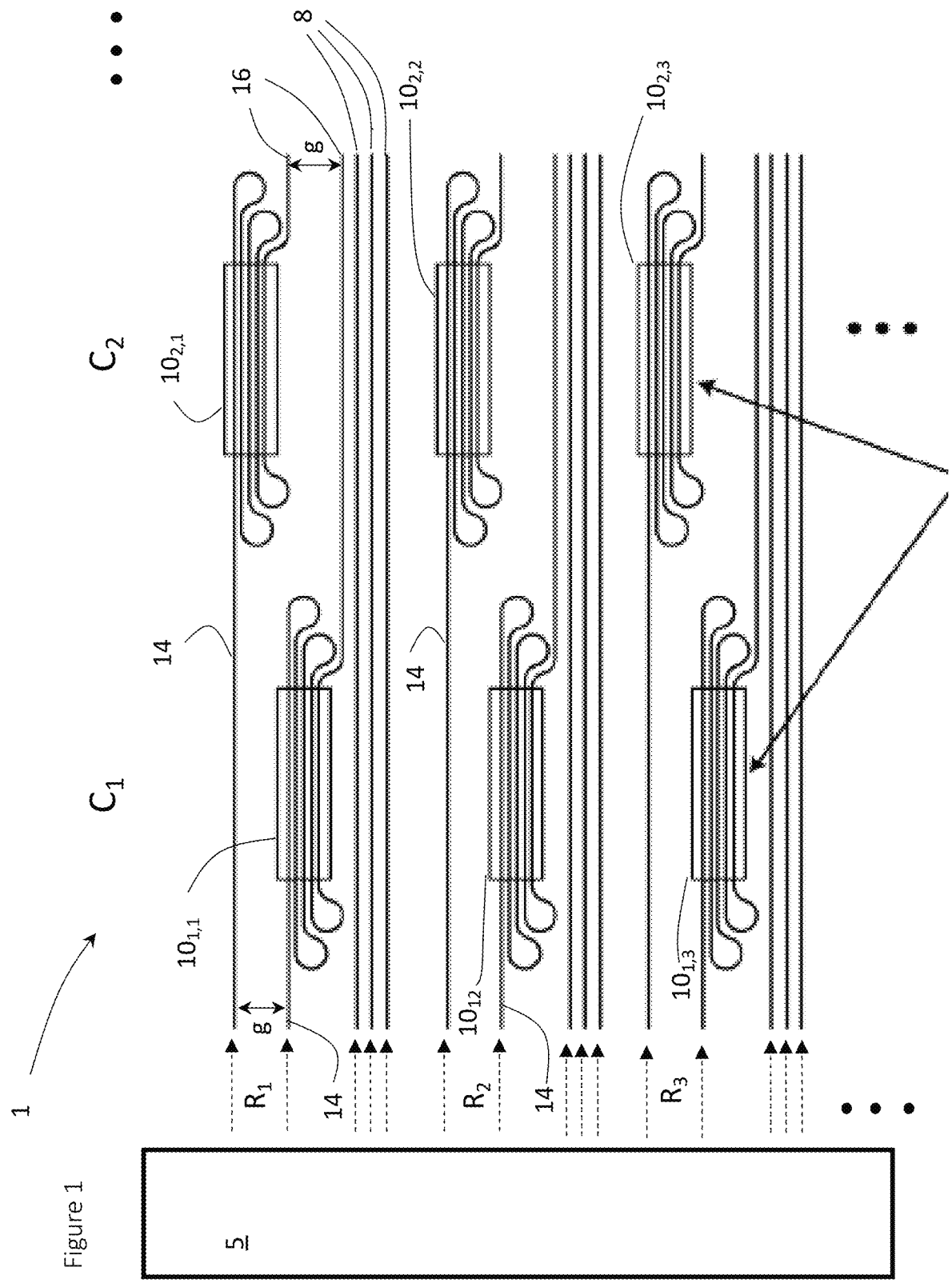
FIG. 1 is a top view of an array of optical phase shifters feeding an optical phased array.

With reference to FIG. 1, an optical phased array 1 may comprise a light source structure 5, and a plurality of phase shifters $10_{M,N}$, which may be arranged into a plurality of (M) columns and a plurality of (N) rows, i.e. forming a 2-dimensional (M×N) array of phase shifters $10_{M,N}$. The light source structure 5 may comprise: 1) a single light source configured to emit a single beam and a tree of optical waveguides, which splits the single beam into a plurality of sub-beams, each sub-beam transmitted by one of a plurality of routing waveguides 8 optically coupled to the light source structure 5; 2) a plurality of light sources, each light source optically coupled to one of the plurality of routing waveguides 8; or 3) a plurality of light sources, each light source optically coupled to a plurality of routing waveguides 8 via a waveguide tree.

Adjacent columns of phase shifters $10_{M,N}$ may be in a staggered configuration, e.g. adjacent phase shifters $10_{M,N}$ in alternating columns may be vertically offset by a predetermined gap g, e.g. by at least a width of one of the phase shifters $10_{M,N}$, so that adjacent phase shifters $10_{M,N}$ are not directly adjacent each other, and so that input waveguides 14, extending into the phase shifter $10_{M,N}$ and output waveguides 16 extending out of each phase shifter $10_{M,N}$ may also be the predetermined gap g width apart, and therefore do not physically overlap or cause any optical crosstalk therebetween.

Routing waveguides 20 extending to extending out between the other phase shifters $10_{M,N}$. The plurality of columns $C_{1-M}$ of phase shifters $10_{M,N}$ and the plurality of rows $R_{1-N}$ of phase shifters $10_{M,N}$ are in a staggered configuration with odd numbered columns, e.g. $C_1$, $C_3$ and $C_5$, of phase shifters $10_{M,N}$ offset, by at least a length of one of the phase shifters $10_{M,N}$ with even numbered columns, e.g. $C_2$, $C_4$ and $C_6$, of phase shifters $10_{M,N}$ with escape waveguides 15 from the even numbered columns of phase shifters $10_{M,N}$ extending between the phase shifters $10_{M,N}$ in the odd numbered columns of phase shifters $10_{M,N}$.

Figure 2A:
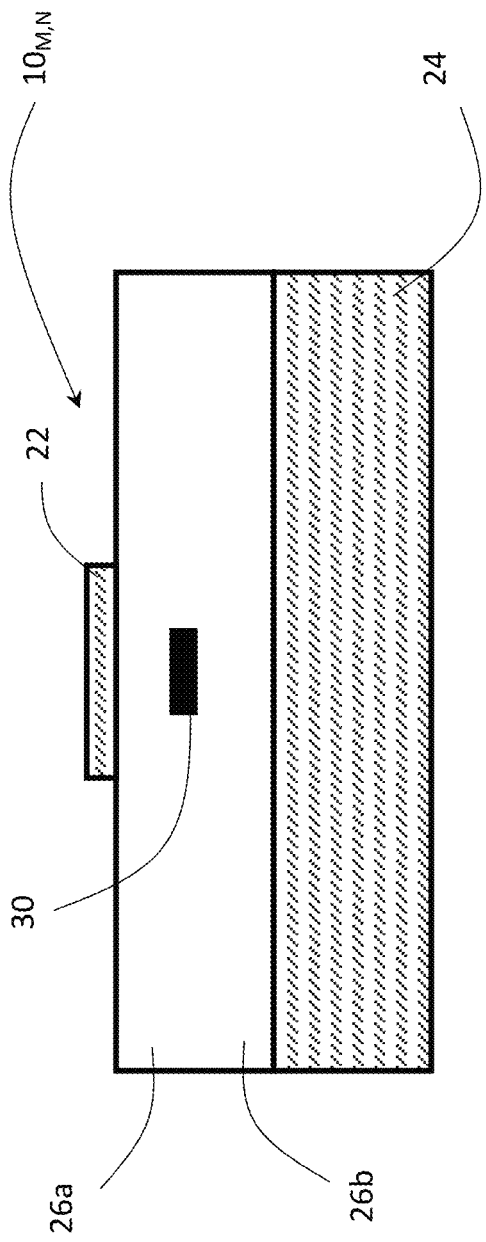
FIG. 2A is a side view of an optical phase shifter.
Figure 2B:
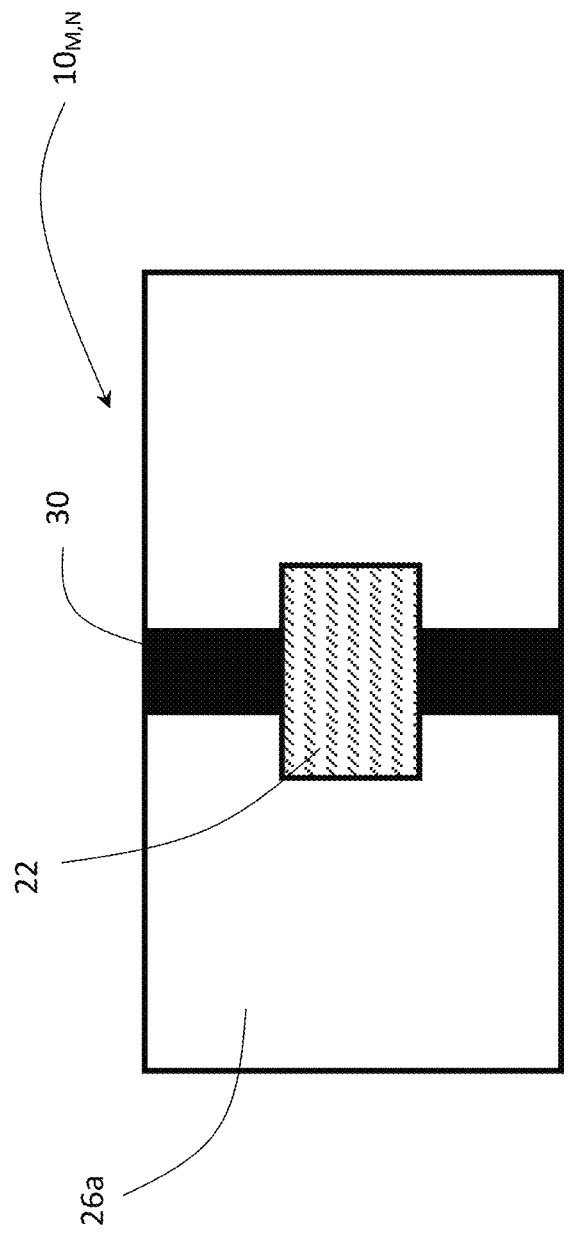
FIG. 2B is a top view of the optical phase shifter of FIG. 2A.

With reference to FIGS. 2A and 2B, each phase shifter $10_{M,N}$ may include a substrate 24, which may be comprised of silicon or other suitable material. Adjacent to, e.g. on top of, the substrate 24 may be layers of cladding, e.g. an upper cladding layer 26a and a lower cladding layer 26b, which may be comprised of a dielectric material, such as silicon dioxide. A heater 22 may be positioned on the upper cladding layer 26a. The heater 22 may be any suitable device or material configured to generate heat, e.g. titanium nitride, nichrome, heavily doped silicon, silicide, titanium, and tungsten. In some embodiments, the heater 22 comprises a resistor, such as a metal or semiconducting wire that heats up when current is passed therethrough. There may be an optical waveguide 30 formed in a device or a waveguide layer positioned between the upper and lower cladding layers 26a and 26b, directly below the heater 22. As depicted in FIG. 2A, the optical waveguide 30 extends parallel to the substrate 24, with the orientation of the optical waveguide 30 parallel to the heater 22, shown in the top view of FIG. 2B. Accordingly, heat from the heater 22 spreads downward through the upper cladding layer 26a and into the optical waveguide 30. Heat also spreads laterally, both in the upper and lower cladding layers 26a and 26b, and the underlying substrate 24. The distribution of heat at the optical waveguide layer falls off over several microns as the distance from the heater 22 and the optical waveguide 30 increases.

The heater 22 may be positioned on top of or within the upper cladding 26A. The heater 22 may be comprised of, for example, a metal, a metal alloy, e.g. nichrome, a conductive metal nitride, or a silicide. Alternatively, the heaters 22 may comprise doping in and/or around the optical waveguide 30 itself, whereby passing current through the optical waveguide layer and/or the optical waveguide 30 causes heating of the optical waveguide 30. Other types of phase shifters $10_{M,N}$ are within the scope of the invention as hereinafter described, and including those disclosed in U.S. patent application Ser. No. 16/826,051 filed Mar. 20, 2020 in the name of the Applicant.

To independently drive the plurality of columns $C_{1-M}$ of phase shifters $10_{M,N}$ and the plurality of rows $R_{1-N}$ of phase shifters $10_{M,N}$ simultaneously, the conventional way is to apply M×N independent DAC channels. However, this inevitably leads to high driver channel count as the number of phase shifters scales, which complicates the wiring layout and controls, and quickly reaches the practical limits of interface pin count.

Figure 3:
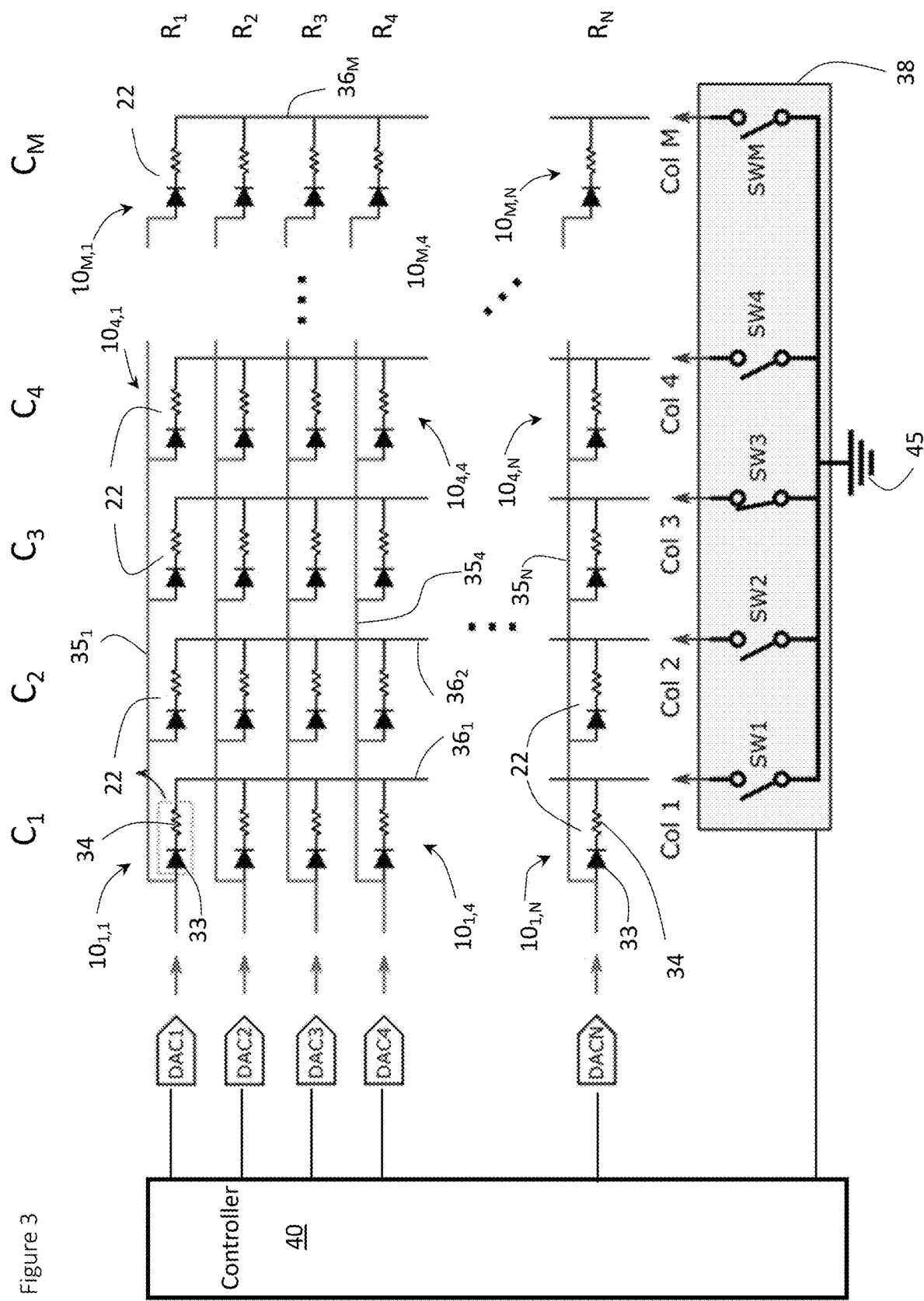
FIG. 3 is a schematic diagram of driver system of the optical phased array of FIG. 1.

With reference to FIG. 3, by taking advantage of a relatively slow thermal time constant of the heaters 22 and by configuring a fast switching row-column driving scheme, all the phase shifters $10_{M,N}$ may be operated simultaneously with a reduced number of digital to analog converter drivers $DAC_1$-$DAC_N$ and interface pin count. As shown in FIG. 3, each heater 22 may comprise a diode 33 connected to a thermal resistor 34 in series forming a diode heater 22, and a first contact, e.g. the anodes, of the diode heaters 22 of each row $R_1$-$R_N$ of phase shifters $10_{M,N}$ may all be electrically connected to a respective common DAC channel ($DAC_1$-$DAC_N$) via suitable electrical wire traces or tracks $35_1$ to $35_N$ extending down each row, and a second contact, e.g. the cathode, of the diode heaters 22 of each column $C_1$-$C_M$ of phase shifters $10_{M,N}$ may all be electrically connected to a common ground-bus $36_1$ to $36_M$ comprising suitable electrical wire traces or tracks extending down each column $C_1$-$C_M$ of phase shifters $10_{M,N}$.

The diodes 23 may comprise silicon PN diodes, silicon PIN diodes, Schottky diodes, germanium diodes or any other suitable diode. The forward voltage and reverse breakdown voltage of the diodes 23 affect system performance and efficiency. The diodes 23 may be configured to include an absolute reverse breakdown voltage larger than the maximum DAC drive voltage, whereby the diodes 23 are configured to block reverse current flow through the heaters 22 to other heaters 22 in other columns $C_1$-$C_M$ of phase shifters $10_{M,N}$ where it is not intended as part of the drive algorithm. Each diode 23 may be configured such that an anode thereof is connected towards the $DAC_1$-$DAC_N$ and a cathode is connected towards a respective one of the ground-bus $36_1$ to $36_M$ (assuming positive DAC voltages).

The ground-buses $36_1$ to $36_M$ of different columns of phase shifters $10_{M,N}$ may be connected to an analog multiplexer 38, for example each of the ground-buses $36_1$ to $36_M$ is connected to a respective switch ($SW_1$-$SW_M$), that enables a controller processor 40, executing instructions saved on non-transitory memory, to select only one column $C_1$-$C_M$ of phase shifters $10_{M,N}$ to connect to ground 45 at the same time, thereby connecting the circuit. The digital to analog converters $DAC_1$-$DAC_N$, and the switches $SW_1$-$SW_M$ may not be located on the same photonic circuit chip as the phase shifters $10_{M,N}$ and may connected to the photonic circuit via wire bonds or bump bonds. For a photonics process that is capable of producing the digital to analog converters $DAC_1$-$DAC_N$, and/or the switches $SW_1$-$SW_M$ on the same die as the photonic circuit including the phase shifters $10_{M,N}$, some or all of the digital to analog converters $DAC_1$-$DAC_N$, and the switches $SW_1$-$SW_M$ may be fabricated and positioned on the same die.

The switches $SW_1$-$SW_M$ in the analog multiplexer 38 may comprise metal oxide semiconductor field-effect transistors (MOSFETs), bipolar junction transistors (BJTs), junction field effect transistors (JFETs), or other transistors configured to form a low-resistance path to the common ground 45. Particularly, it is preferable to have a resistance in each switch $SW_1$-$SW_M$ much less than, e.g. typically less than one tenth of, the resistance in the thermal phase shifters $10_{M,N}$ to minimize cross talk and maximize accuracy of the set phase shift. N-type field effect transistors are often preferred because they provide a low-resistance path to ground, i.e. a low on-resistance, and have very low built-in voltage across the switch $SW_1$-$SW_M$, i.e. the drain to source voltage, thereby allowing the ground-busses $36_1$-$36_M$ to remain at the lowest possible voltage relative to the DAC drive voltages. The built in voltage of each switch $SW_1$-$SW_M$ and each ground bus $36_1$-$36_M$ is typically less than 1 Volt. It may be beneficial to configure the switches $SW_1$-$SW_M$ using more than one transistor per switch $SW_1$-$SW_M$, for example a transmission gate, or adding additional control transistors to decode a signal from the controller processor 40 or ensure that only one switch $SW_1$-$SW_M$ is closed at a time, i.e. break before make switching.

Figures 4A, 4B:
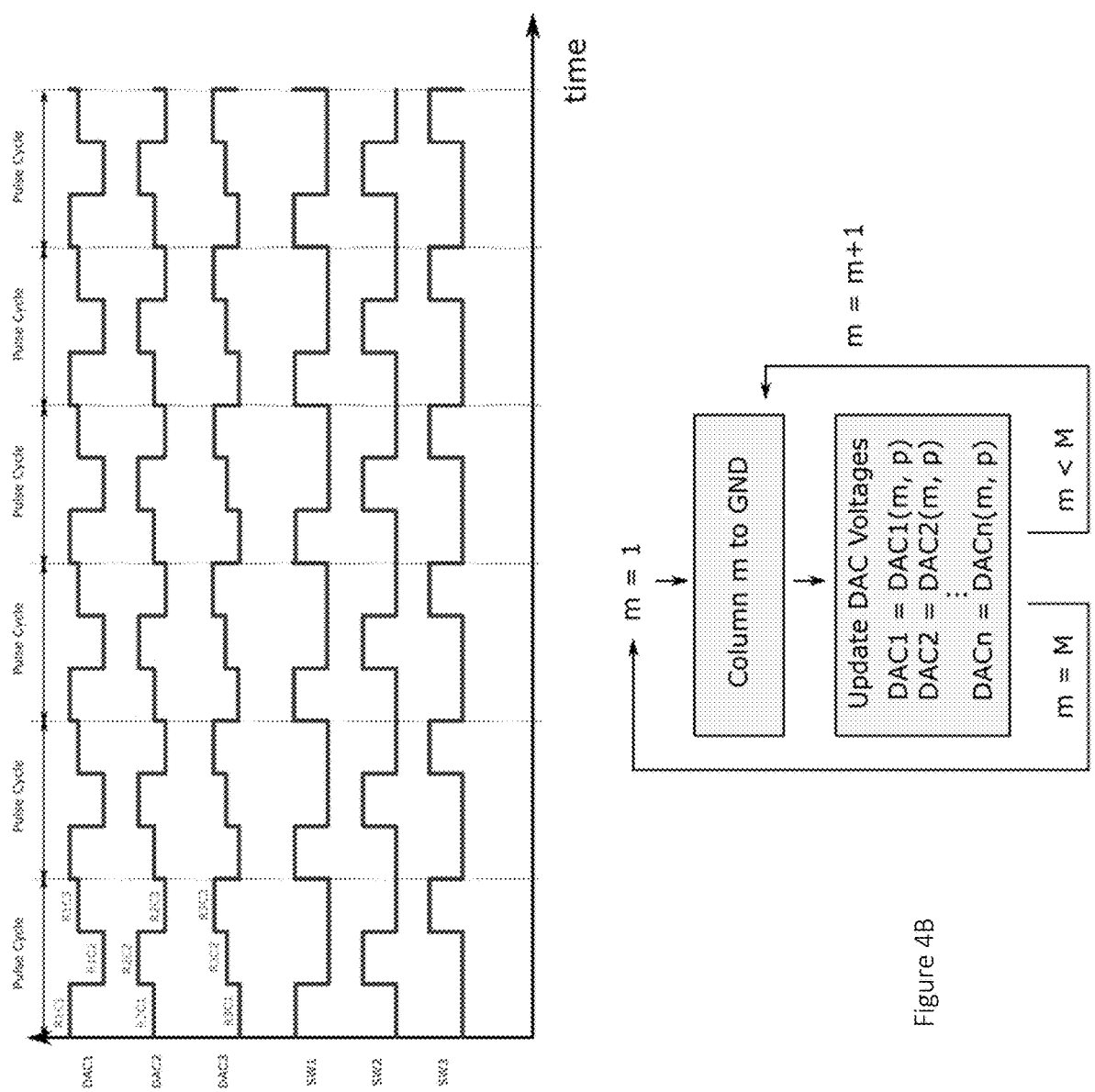
FIG. 4A is a graph of time vs voltage or current for a plurality of DACs and a plurality of switches in a plurality of pulse cycles.
FIG. 4B is a flow chart of a pulse cycle.
Figure 5:
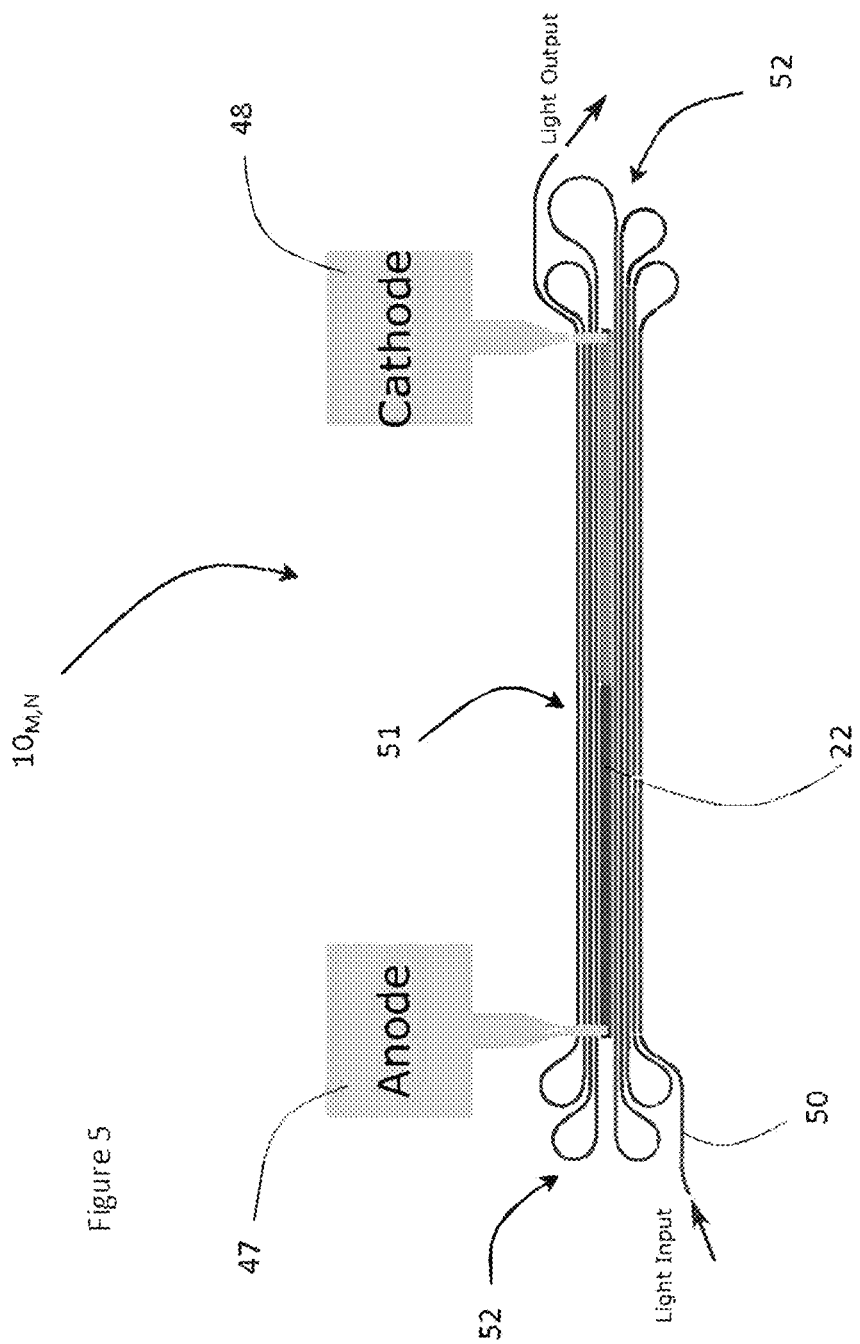
FIG. 5 is a top view of a multi-pass waveguide phase shifter, in accordance with an exemplary embodiment of the present disclosure.
Figure 6A:
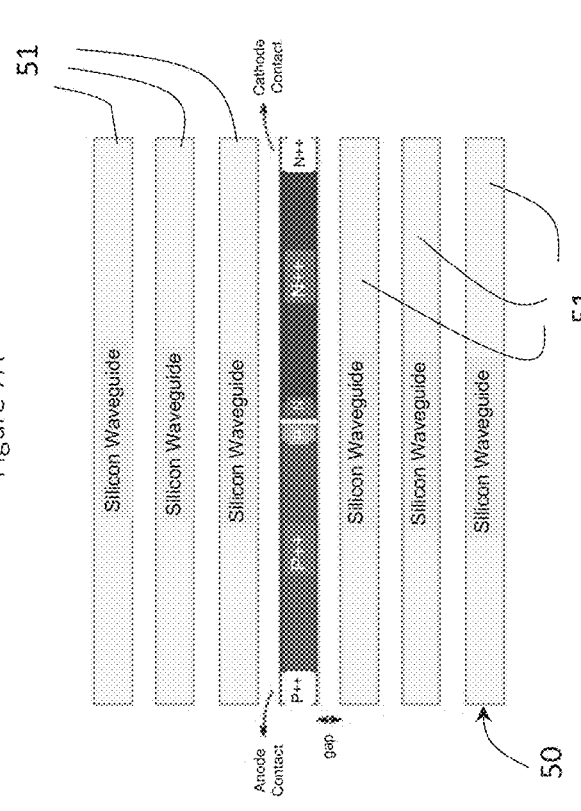
FIG. 6A is a top view of an exemplary optical waveguide arrangement of the multi-pass optical waveguide phase shifter of FIG. 5.
Figure 6B:
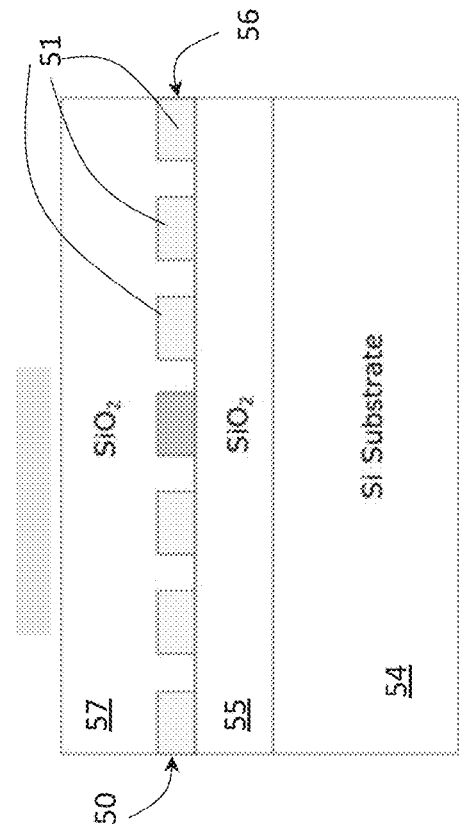
FIG. 6B is a cross-section view of the optical waveguide arrangement of FIG. 6A.
Figure 7A:
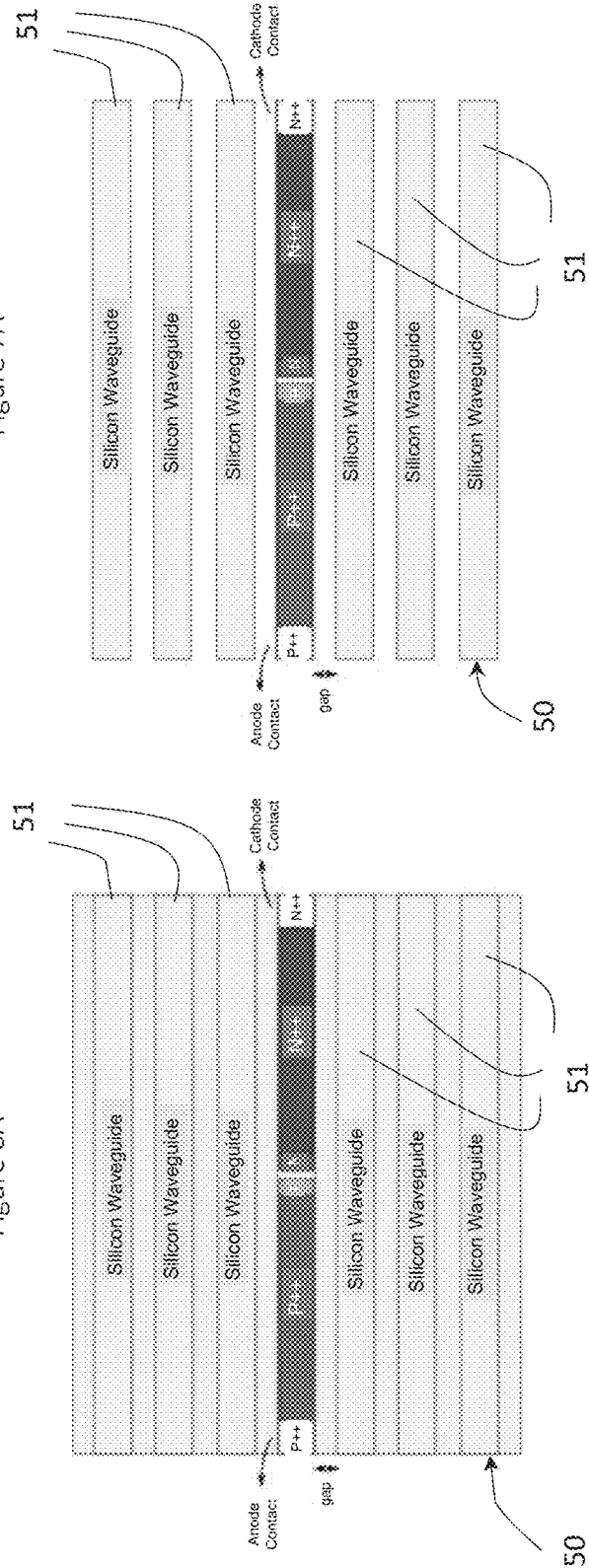
FIG. 7A is a top view of an exemplary optical waveguide arrangement of the multi-pass optical waveguide phase shifter of FIG. 5.
Figure 7B:
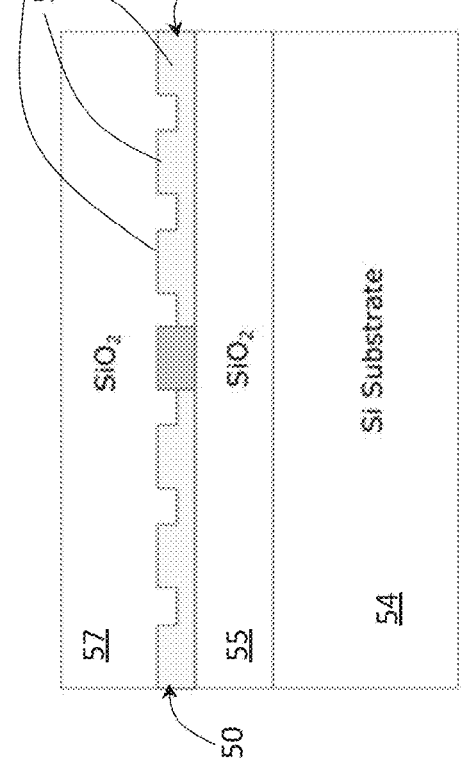
FIG. 7B is a cross-section view of the optical waveguide arrangement of FIG. 7A.

As shown in FIGS. 4A and 4B, when one of the columns, e.g. $C_1$, of phase shifters $10_{M,N}$ is selected, e.g. $SW_1$ is connected to ground 45, by the controller processor 40 comprised of suitable hardware and software, executing instructions stored on non-transitory memory, the digital to analog converters $DAC_1$-$DAC_N$ on each row $R_1$-$R_N$ of phase shifters, e.g. $10_{1,1}$-$10_{1,N}$ will feed current into the diode heaters 22 in that column and row combination (M, N). Current does not flow in other columns of phase shifters $10_{M,N}$, e.g. columns $C_2$-$C_M$, because the switches, e.g. switches $SW_2$-$SW_N$, are opened by the controller processor 40 and there is no path to ground 45. Similarly, current flow through other unintended diode heaters 22 may be prevented by the reverse bias blocking behavior of the diodes. To feed current to the next column of phase shifters $10_{M,N}$, the switch, e.g. switch $SW_2$, on the next column $C_2$ of phase shifters $10_{M,N}$ is selected by the controller processor 40 and the switch, e.g. $SW_1$, on the previous column of phase shifters $10_{M,N}$, e.g. column $C_1$, is deselected, and the digital to analog converters $DAC_1$-$DAC_N$ on each row $R_1$-$R_N$ of phase shifters, e.g. phase shifters $10_{2,1}$-$10_{2,N}$, is updated to a new set of DAC values that corresponds to the new column of phase shifters $10_{M,N}$, e.g. column $C_2$, and row, e.g. rows $R_1$-$R_N$, combination. After all columns $C_1$_CN of phase shifters $10_{M,N}$ are sequentially switched on, while the other columns of phase shifters $10_{M,N}$ are switch off, the controller processor 40 cycles back and switches to the first column, e.g. $C_1$, of phase shifters $10_{1,N}$ and repeats the process indefinitely. With reference to FIG. 4A, the one cycle is called a pulse cycle.

FIG. 4A also marks the $R_N C_M$ that corresponds to when current is fed into that phase shifter $10_{M,N}$ in the timing diagram. For example, the noted $R_2 C_1$ is when current is injected into the heater 22 for row 2 column 1 of phase shifters $10_{1,2}$, therefore, this heater 22 only sees one pulse of current injection for every pulse cycle. As a result, the total pulse cycle time $T_{pulse}$ for the array of phase shifters $10_{1,1}$ to $10_{M,N}$ is the number of columns M×the switch dwell time $t_{dwell}$ for each switch $SW_1$-$SW_M$ or $T_{pulse} = t_{dwell} * M$.

Note that FIG. 4A only shows an exemplary embodiment in which the digital to analog converters $DAC_1$-$DAC_N$ are supplying constant voltages (or currents) within the switch dwell time $t_{dwell}$. In practice, the digital to analog converters $DAC_1$-$DAC_N$ may supply a time-varying voltage (or current) waveform within the switch dwell time $t_{dwell}$ to each heater 22. The thermal time constant of the heater 22 effectively averages or filters out fast changes in the output of the digital to analog converters $DAC_1$-$DAC_N$. In one arrangement, a time-varying voltage or current may be pulse width modulated, whereby each digital to analog converters $DAC_1$-$DAC_N$ turns on to a high voltage or current for some amount of time and then turns off to a low voltage or current, and the total energy delivered to the heater 22 is controlled by the duration for which each digital to analog converter $DAC_1$-$DAC_N$ is turned on. To ensure a constant temperature, the pulse cycle time $T_{pulse}$ may be much shorter than the thermal time constant of the heater 22, therefore, the heater temperature will rise to a constant value, with very slight ripples. The number of columns M will limit the switching speed. To minimize the ripple, the pulse cycle time $T_{pulse}$ is ideally less than or equal to about 1/100th of the thermal time constant of the heater 22. For example, if the thermal time constant is 100 ms, then the pulse cycle time $T_{pulse}$ may be less than or equal to 1 ms, and then the switch dwell time $t_{dwell}$ may be 100 ns for 10 columns (M=10). Therefore, a switching time if 1/10 of switch dwell time $t_{dwell}$=10 ns is still very manageable for common discrete transistor or integrated-circuit switches. Faster switching would allow a larger number of columns of phase shifters $10_{M,N}$ for a similar pulse cycle time $T_{pulse}$. As more rows and columns of phase shifters $10_{M,N}$ are connected, a larger current will flow through each ground bus $36_1$ to $36_M$ and then through each switch $SW_1$-$SW_M$. Therefore, the switches $SW_1$-$SW_M$ and the ground-buses $36_1$ to $36_M$ need to handle higher currents as more rows of phase shifters $10_{M,N}$ are added. For example, considering M=10 and N=10, if each phase shifters $10_{M,N}$ consumes 6 mW DC power for a 2p phase shift (maximum phase shifter set value for OPA), an M=10 means a momentary 10× power in the pulse, which is 60 mW. If a 3.3V drive, e.g. power source, is used, then each digital to analog converters $DAC_1$-$DAC_N$ supplies about 18 mA, and the maximum transient current flowing through the ground-bus $36_1$ to $36_M$ and each switch $SW_1$-$SW_M$ is 18 mA×N (rows)=180 mA. Therefore, it is usually desirable to use a higher voltage to minimize the current. For the same example, using a 10V drive lowers the maximum transient current flowing through each ground bus $36_1$ to $36_M$ to 60 mA. However, in this example, a 10×10 (100 phase shifters $10_{M,N}$) OPA only requires 10 DAC channels and 20 pins to interface.

The non-transitory memory saves the values (voltage or current) for the digital to analog converters $DAC_1$-$DAC_N$ assigned to each phase shifter $10_{M,N}$ in each corresponding row of phase shifters $10_{M,N}$. The values for each DACn(m,p) may be a constant. The values for each DACn(m,p) may be a time-varying waveform.

With reference to FIG. 4B, a method of operating the optical phased array driver may be described by the following steps:

i) Switch the first ground bus (M=1), e.g. close the first switch $SW_1$, to ground 45, disconnecting all other switches, e.g. open switches $SW_2$ to $SW_M$.

ii) Update the DAC channels, e.g. the voltage or current values, from the non-transitory memory, in all N rows of phase shifters $10_{M,N}$ to the corresponding values for the M=1 column of phase shifters $10_{1,N}$ and optionally the $p^{th}$ steering direction (DACn(1, p)). Each row $R_1$ to $R_N$ of phase shifters $10_{M,N}$ may be set to a different voltage, and each column $C_1$ to $C_M$ of phase shifters $10_{M,N}$ may require a different set of row voltages. The phase shifters $10_{M,N}$ may be configured such that the light exiting the device would form a flat phase front pointed toward the $p^{th}$ steering direction. However, because of fabrication imperfections on the chip and crosstalk between phase shifters $10_{M,N}$, the phase shifter voltage/current values needed to create this output phase are typically pretty random and may need to be stored in a look up table in the non-transitory memory or even computed dynamically by the controller processor 40 with some sort of feedback. Analog control of each heater 22 by the controller processor 40 may be necessary because an arbitrary phase shift may be needed for any-angle beam steering in an OPA. This is complicated further because of mismatch and crosstalk between the phase shifter channels and the optical waveguides connecting them.

iii) Switch to the next ground bus (m=m+1), e.g. close the second switch $SW_2$, to ground 45, all other switches open.

iv) Update the DAC channels, e.g. the voltage or current, in all N rows of phase shifters $10_{M,N}$ to the corresponding values, from the non-transitory memory, to the corresponding values for the m+1 column and optionally the $p^{th}$ steering direction (DACn(m, p)).

v) Repeat steps iii) and iv) until each column of phase shifters $10_{M,N}$ has been switched on sequentially by switches $SW_1$-$SW_M$, while the other columns of phase shifters $10_{M,N}$ are turned off, e.g. open switches $SW_1$-$SW_M$.

vi) steps i) to v) may be repeated while the steering direction p is updated during this indefinite loop to steer the beam into new directions.

The loop of this method may be executed via the controller processor 40, so that the time to execute one cycle of the loop through steps i. to v. is faster than the thermal time constant of the heaters 22. This way, although not all heaters 22 may be simultaneously driven, their temperature will not fluctuate significantly, and thus the phase shifters $10_{M,N}$ will have relatively constant phase shift. The faster steps i. through v. are executed and the slower the thermal time constant, the smaller the ripple in phase shift.

With reference to FIGS. 5, 6A, 6B, 7A and 7B, each phase shifter $10_{M,N}$ may include an optical waveguide 50 comprised of a plurality of optical waveguide sections 51, which may be straight and parallel to each other, routed adjacent to the heater 22 in a serpentine fashion, connected by optical waveguide bends 52 at each end thereof for directing light back through the subsequent one of the plurality of waveguide sections 51. Similar to the embodiment shown in FIGS. 2A and 2B, the phase shifter $10_{M,N}$ comprises a substrate 54, e.g. silicon, adjacent to a lower cladding layer 55, e.g. silicon dioxide, an optical waveguide layer 56, including the plurality of optical waveguide sections 51, and an upper cladding layer 57 above the waveguide layer 56. The heater 22 may be integrated into a strip of waveguide material in the optical waveguide layer 56, although other heater arrangements are possible, such as the heaters 22 to the side of the waveguide 50 in the same waveguide material layer 56, or heaters 22 made of a metal or ceramic material embedded in the upper cladding layer 57. In the embodiments shown in FIGS. 6A and 6B, there are at least six waveguide sections 51 included in the optical waveguide 50 that extend parallel to the heater 22.

A function of the diodes 23 is to prevent current from each digital to analog converter $DAC_1$-$DAC_N$ from flowing from the selected column of phase shifters $10_{M,N}$ into the other non-selected columns of phase shifters $10_{M,N}$ via the electric traces or tracks 26 in each row $R_1$-$R_N$. Therefore, the reverse-bias breakdown voltage of the diodes 23 should be higher than the maximum drive voltage in any instance for all the digital to analog converter $DAC_1$-$DAC_N$ channels.

Connecting on-chip heaters 22 with an external pn-diode 23 will lower power efficiency caused by the native built-in potentials for the diodes 23, which is typically around 0.7 V for a silicon pn device. When forward biasing the heater 22, the pn-diode 23 in series will consume a constant dc power equal to $i_{total} \times V_{turn-on}$, which generates heat, where $i_{total}$ is the current flowing through both the diode 23 and the heater 22 and $V_{turn-on}$ is the turn-on voltage of the pn-diode 23. Moreover, there is also the series resistance associated with the pn-diode 23 that also consumes power and generates heat. In configurations where the diode 23 is physically separated from the phase shifter $10_{M,N}$, this power dissipated in the diode 23 is lost to heat and does not cause optical effects. Silicon is referenced throughout the disclosure, but other materials, such as other optical waveguide materials are also within the scope of the invention.

Figures 8A, 8B:
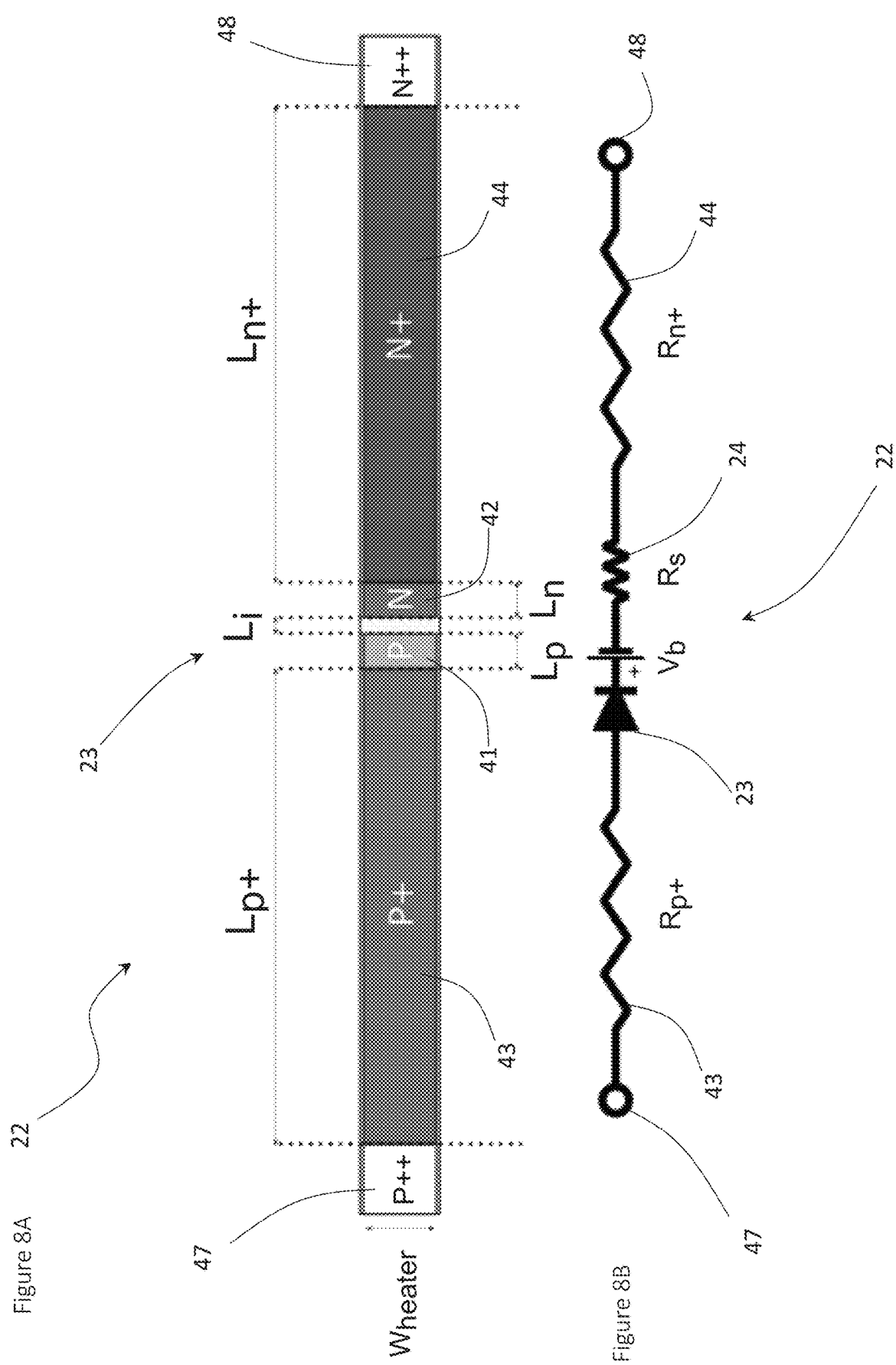
FIG. 8A is a top view of an exemplary doped silicon heater of the multi-pass optical waveguide phase shifter of FIG. 5.
FIG. 8B is a schematic diagram of the doped silicon heater of FIG. 8A.

The power efficiency may be improved by integrating the pn-diode 23 close to each phase shifter $10_{M,N}$ as part of the heater (diode heater) 22, meaning that the heat otherwise wasted now also contributes to heating the optical waveguide sections 51. Accordingly, the heater 22 may comprise an on-chip heater with an integrated pn-diode 23. The heater 22 may comprise two long heating sections of heavily-doped waveguide material, e.g. silicon, with opposite polarities (p and n). A pn-diode 23 may be sandwiched in the center along the shorter edges of the two heating sections, where the p-doped section may be connected to the anode of the pn-diode 23, and the n-side heating section is connected to the cathode of the pn-diode 23. An exemplary diode heater 22 and an equivalent circuit are shown in FIG. 8, which the diode heater 22 may comprise three main parts: 1) p-doped anode 41, e.g. silicon with a doping level at 5e16 1/cm$^3$ to 5e18 1/cm$^3$, 2) pn-diode, e.g. silicon, 23, and 3) n-doped cathode 42, e.g. silicon with a doping level at 5e16 1/cm$^3$ to 5e18 1/cm$^3$. The pn-diode 23 may be sandwiched between a longer heavily p-doped section 43, e.g. of silicon, including a doping material with a higher concentration of p-doping than the p-portion of the pn-diode 23, and a longer heavily n-doped section 44 including an n-doping material with a higher concentration of n-doping than the n-potion of the pn-diode 23. The heavily p-doped section 43, e.g. P+ silicon, may be connected to the anode 41 of the pn-diode 23, and the heavily n-doped section 44, e.g. N+ silicon, may be connected to the cathode 42 of the pn-diode 23. The heavily p-doped section 43 or the heavily n-doped section 44 may also include a layer of silicide formed on top to further reduce their resistivities. The silicide formation is a standard process in silicon photonics foundries that is typically used in forming ohmic contact between silicon and metals.

The lengths, widths, and sheet resistivities of the heavily p-doped section 43 and the heavily n-doped section 44 dominate the overall resistance of the diode heater 22, since the series resistance of the pn-diode 23 is typically a much smaller value. The reverse breakdown voltage of the pn-diode 23 may be adjusted by changing the length of the intrinsic region $L_i$. The larger the intrinsic region $L_i$ the larger the breakdown voltage of the pn-diode 23. However, a longer intrinsic region $L_i$ comes with the price of increased series resistance, which could cause non-uniform heating mostly in the center where the pn-diode 23 is located. This non-uniform heating may reduce the thermal-optic efficiency. The lengths of both the p-doped portion $L_p$ and the n-doped portion $L_p$ in the pn-diode 23 will also change the turn-on characteristics and series resistance of the pn-diode 23. An anode contact 47 and a cathode contact 48 may be placed on the far opposite ends of the diode heater 22 connecting to the heavily p-doped section 43 and the heavily n-doped section 44, respectively to minimize heat sinking that also reduces the efficiency of the heater 22. The interface between the anode contact 47 and the cathode contact 48 and the p-doped section 43 and the heavily n-doped section 44, respectively, may have a silicide layer to ensure ohmic contact.

Both the anode and cathode contacts 47 and 48 may be formed on the very edge of the heater 22 for electrical access. The width $W_{heater}$ of the heater 22 may be between 0.2 µm to 10 µm. The lengths of the heavily-doped silicon sections $L_{p+}$ and $L_{n+}$ are ideally between 10 µm to 1000 µm. The lengths of the p-doping portion $L_p$ and the n-doping portion $L_n$ in the pn-diode 23 may be between 0 to 2 µm. The length of the intrinsic region $L_i$ in the pn-diode 23 is ideally between 20 nm to 2 µm. In some embodiments, the intrinsic region $L_i$ of the diode 23 may be omitted, an p and n doping portions may touch directly. Ideally, the pn junction is placed in close enough proximity to the optical waveguide sections 51 of the phase shifter $10_{M,N}$ so that power dissipated on the pn-junction heats the waveguide sections 51 and causes a phase shift in light transmitted therein. The heater 22 may be placed right next to an array of waveguide sections 51, whereas each waveguide section 51 may be either a single waveguide or a ridge waveguide. The gaps (on both sides) between the heater 22 and the waveguide sections 51 may be between 0.4 µm to 2 µm.

The optical phase shifter $10_{M,N}$, as shown in FIGS. 6A to 7B, may be achieved through the relatively high thermo-optic coefficient in the optical waveguide material, e.g. silicon, which may be about 10 times more than the cladding layers 55 and 57, e.g. silicon nitride, via which the refractive index of the optical waveguide material, e.g. silicon, will change according to the temperature. Therefore, by placing the diode heater 22 very close to the waveguide sections 51, e.g. adjacent in the same waveguide layer 56, as forward bias is applied and current flows through the diode heater 22, the local temperature around the diode heater 22, including the optical waveguide sections 51, will increase, resulting in a change in the refractive index in the waveguide material. The light passing through the heated waveguide sections 51 then experiences an extra phase shift. Since the waveguide sections 51 and the diode heater 22 may be integral with and fabricated on the same waveguide, e.g. silicon, layer 56, there may also be a slab layer, e.g. silicon (FIG. 7A) connecting the diode heater 22 and the optical waveguide sections 51 that improves the thermal conduction. However, the gap between the diode heater 22 and the waveguide sections 51 and their dimensions can be carefully chosen to: 1) avoid excessive loss, and 2) reduce optical coupling between the optical waveguide sections 51 and the diode heater 22.

The heater 22 may also be used to heat up an alternative serpentine phase shifter $10_{M,N}$, such as the one disclosed in U.S. patent application Ser. No. 16/826,051, filed Mar. 20, 2020 in the name of the Applicant, which is incorporated herein by reference. This allows heating up multiple adjacent waveguide sections 51 directly or indirectly adjacent to or nearby the heater 22 at the same time.

The embodiments of thermal phase shifters $10_{M,N}$ may be arranged in a serpentine fashion, thereby increasing the total length of waveguide being heated by a singular heater 22. By routing the light in this manner, such that it makes several passes under or near the same heater 22, it is possible to salvage some of the heat that is otherwise wasted. This results in an increase in phase shift, associated with the increase in the heated length of waveguide, without increasing the length or the power consumption of the heater 22.

However, there are constraints associated with placing additional optical waveguide sections under or near the heater 22, e.g. in a serpentine arrangement. Typically, the optical waveguide sections 51 must be spaced several microns apart to eliminate optical leakage between adjacent optical waveguide sections 51. This typically-required spacing of several microns means that the optical waveguide sections 51 farther away from the center of the heater 22 have significantly less temperature change than any waveguide sections 51 proximate to the center of the heater 22, limiting the number of passes under or adjacent to the heater 22 and the ultimate efficiency gain of the technique.

Although thermal phase shifter configurations using a serpentine arrangement of waveguides have been proposed before, they do not address the constraints that limit the efficiency gain of the technique. For instance, some systems have proposed waveguides that are arranged in a serpentine fashion in order to increase efficiency and minimize power consumption. However, such waveguides all use the same cross sections, e.g. they are of the same width, which limits the number of passes under the heater.

Figure 9A:
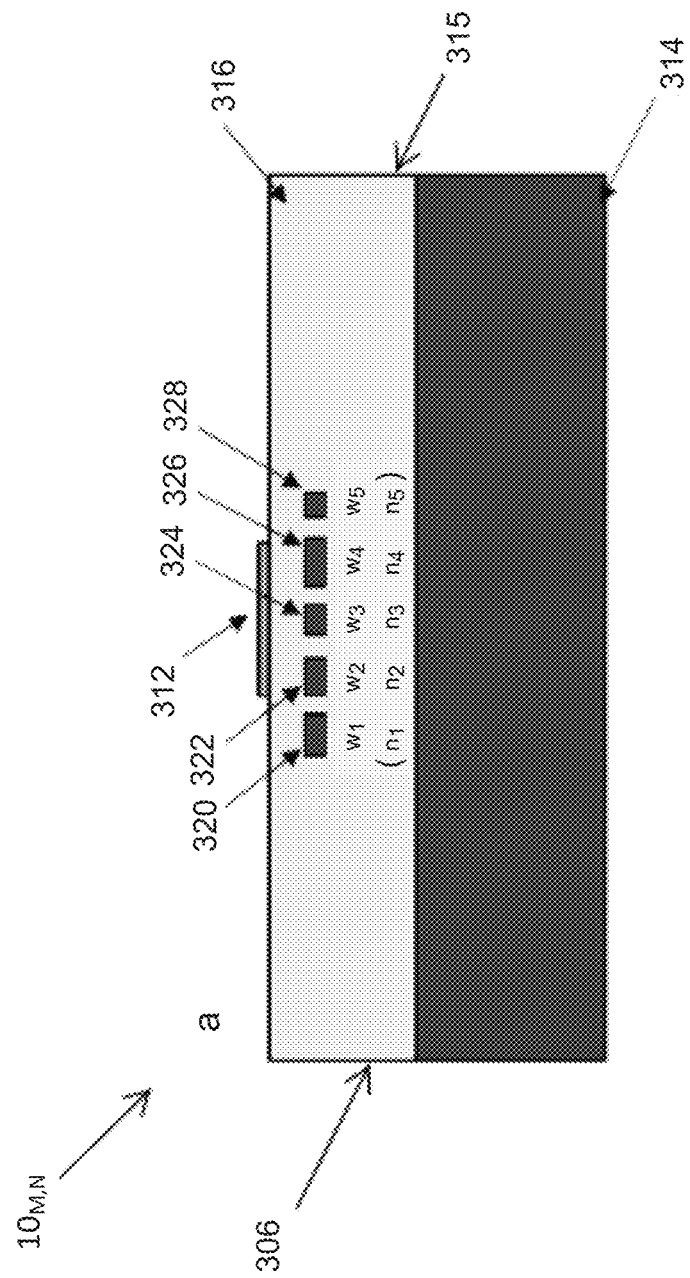
FIG. 9A is a top view of an exemplary optical waveguide arrangement of the multi-pass optical waveguide phase shifter.
Figure 9B:
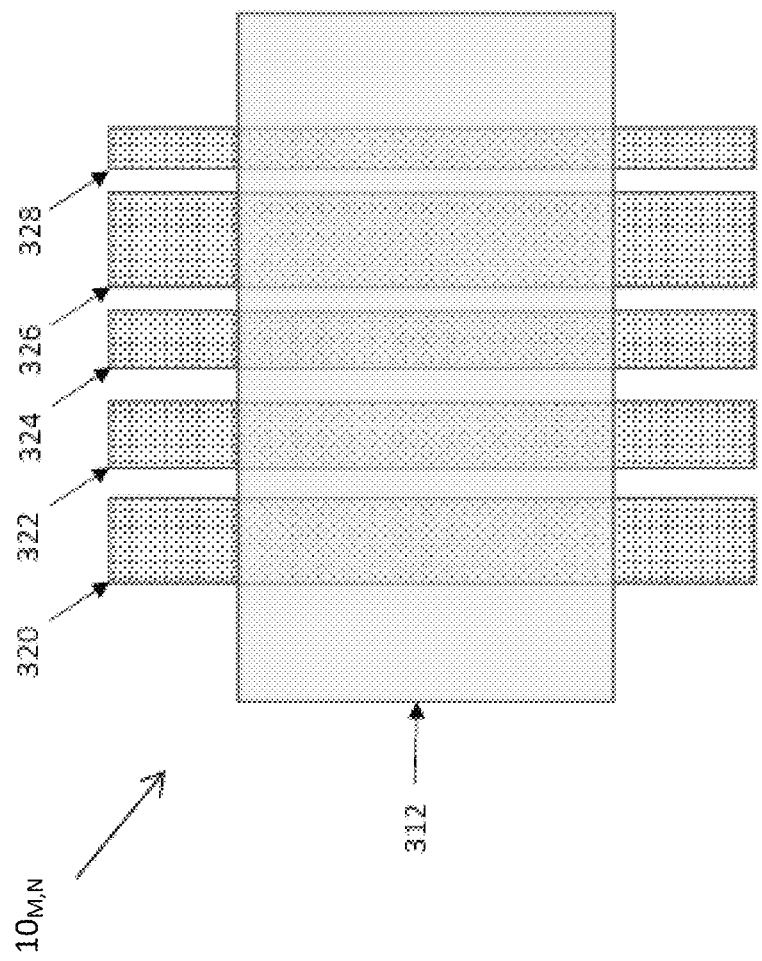
FIG. 9B is a cross-section view of the optical waveguide arrangement of FIG. 9A.

With reference to FIGS. 9A and 9B, the phase shifter $10_{M,N}$ may include a waveguide 304 comprised of optical waveguides sections 320, 322, 324, 326, and 328, which may be straight and parallel to each other, are routed under or proximate a heater or heating element 312 in a serpentine fashion, with each of the optical waveguide sections 320, 322, 324, 326, and 328 including different widths or at least adjacent optical waveguide sections 320, 322, 324, 326, and 328 or at least optical waveguides spaced within twice the pitch away, including different widths, so that the waveguide sections 320, 322, 324, 326, and 328 have weak coupling with each other, and therefore may be placed closer together under the heating element 312. Similar to the embodiment shown in FIGS. 6B and 7B, the phase shifter $10_{M,N}$ of FIGS. 9A and 9B comprises a substrate 314, e.g. silicon, adjacent to a cladding layer, e.g. silicon dioxide, which may be comprised of a lower cladding layer 315 and an upper cladding layer 316 below and above, respectively, the optical waveguide sections 320, 322, 324, 326, and 328. A heating element 312 may be mounted on top of positioned in the upper cladding layer 316, although other heater arrangements are possible. In the embodiment shown in FIGS. 9A and 9B, there are five waveguide sections 320, 322, 324, 326, and 328 that run underneath the heating element 312. Each of the waveguide sections 320, 322, 324, 326, and 328 may include a different propagation constant ($n_i$), e.g. a different width ($w_i$), a different thickness, a different doping concentration or a different material refractive index of all or part of the waveguide section, e.g. waveguide sections 320, 322, 324, 326, and 328 or the cladding surrounding, e.g. upper cladding layer 316, lower cladding layer 315 or beside, the waveguide section, whereby adjacent parallel waveguide sections each comprise a different propagation constant, to exhibit and/or increase a wavevector mismatch between immediately adjacent straight parallel waveguide sections to decrease coupling therebetween.

Figure 10:
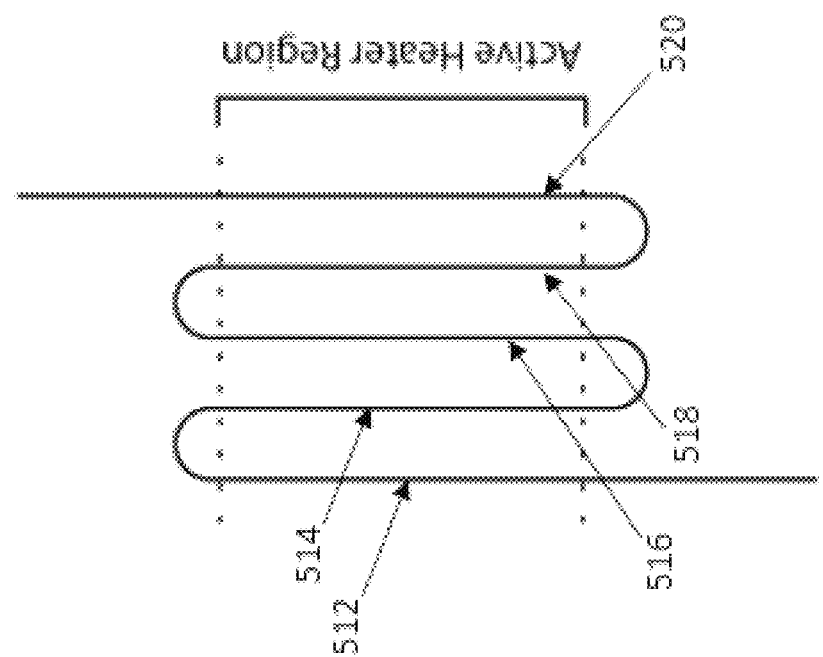
FIG. 10 is a top view of an exemplary optical waveguide arrangement of the multi-pass optical waveguide phase shifter.

FIG. 10 illustrates a simple serpentine routing scheme that connects five straight waveguide sections 512, 514, 516, 518, and 520. This routing scheme requires (N−1) bends for N passes through the heated section, with each bend section including a radius of curvature (or bend radius), e.g. half the waveguide pitch. However, routing the waveguide sections 512, 514, 516, 518, and 520 in such a tightly-packed serpentine structure requiring bend radii of half the waveguide pitch (below 400 nm) may cause problems, since silicon channel waveguides can typically only tolerate bend radii as small as 1 μm-2 μm without significant optical loss over the bend.

Figure 11:
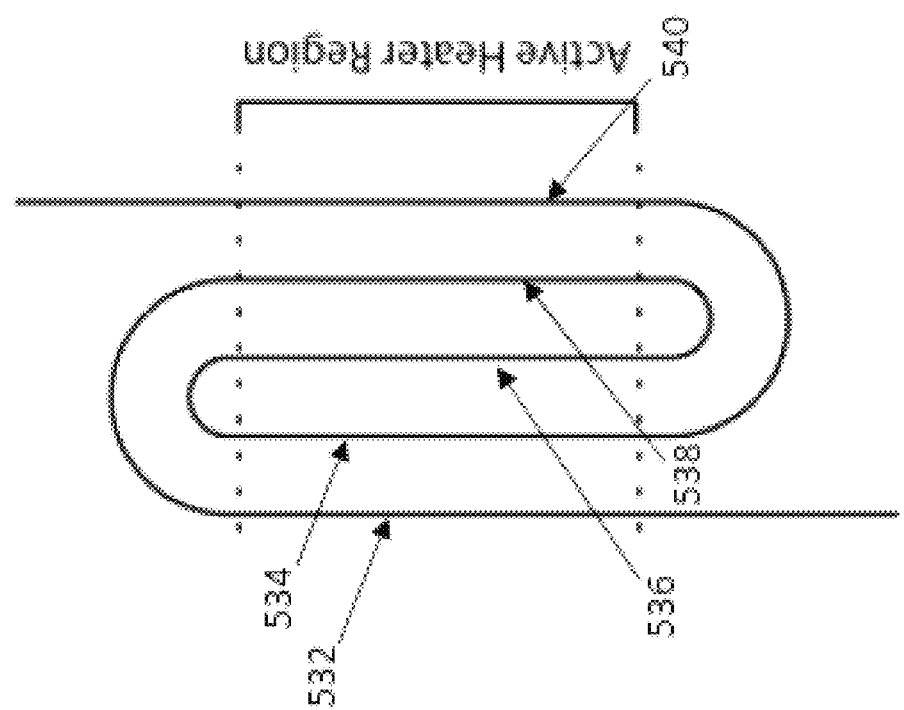
FIG. 11 is a top view of an exemplary optical waveguide arrangement of the multi-pass optical waveguide phase shifter.

FIG. 11 illustrates a spiral-type routing scheme for connecting the five waveguide sections 532, 534, 536, 538, and 540, with some bends, e.g. the first and last outer bends having a larger radius, e.g. 1.5× the waveguide pitch or greater than 1 μm, and some bends, e.g. the second and third inner bends having a smaller radius, e.g. 0.5× the waveguide pitch or ⅓ the larger radius. In comparison to the routing scheme shown in FIG. 10, the spiral-like routing presented in FIG. 11 increases the radius of some bends, but still requires a minimum radius of half the waveguide pitch. This is the arrangement for 5 passes/4 bends. More generally, for N bends, the first and last bend index may have the largest radius, the second and second last bends may have the next smaller radius, the third and the third last bends may have the next smaller, and so on, such that bend [i] and bend [N−i+1] have the same radii. Another way to conceptualize is to see FIG. 11 as a waveguide that has been "twisted" onto itself about the center heater.

Figure 12:
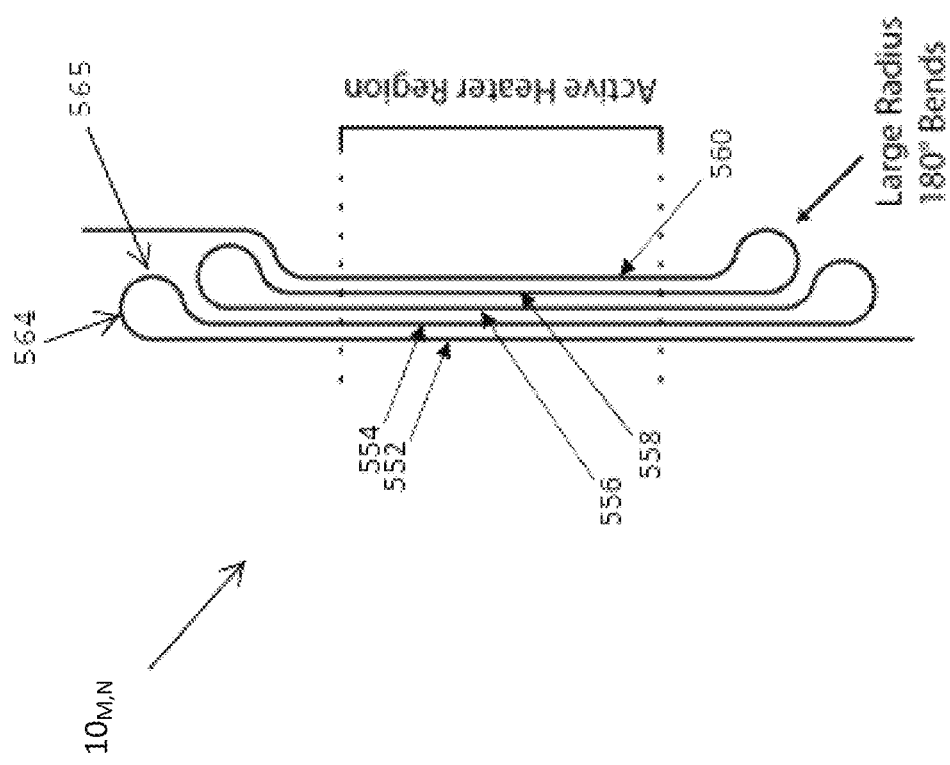
FIG. 12 is a top view of an exemplary optical waveguide arrangement of the multi-pass optical waveguide phase shifter.
Figure 13:
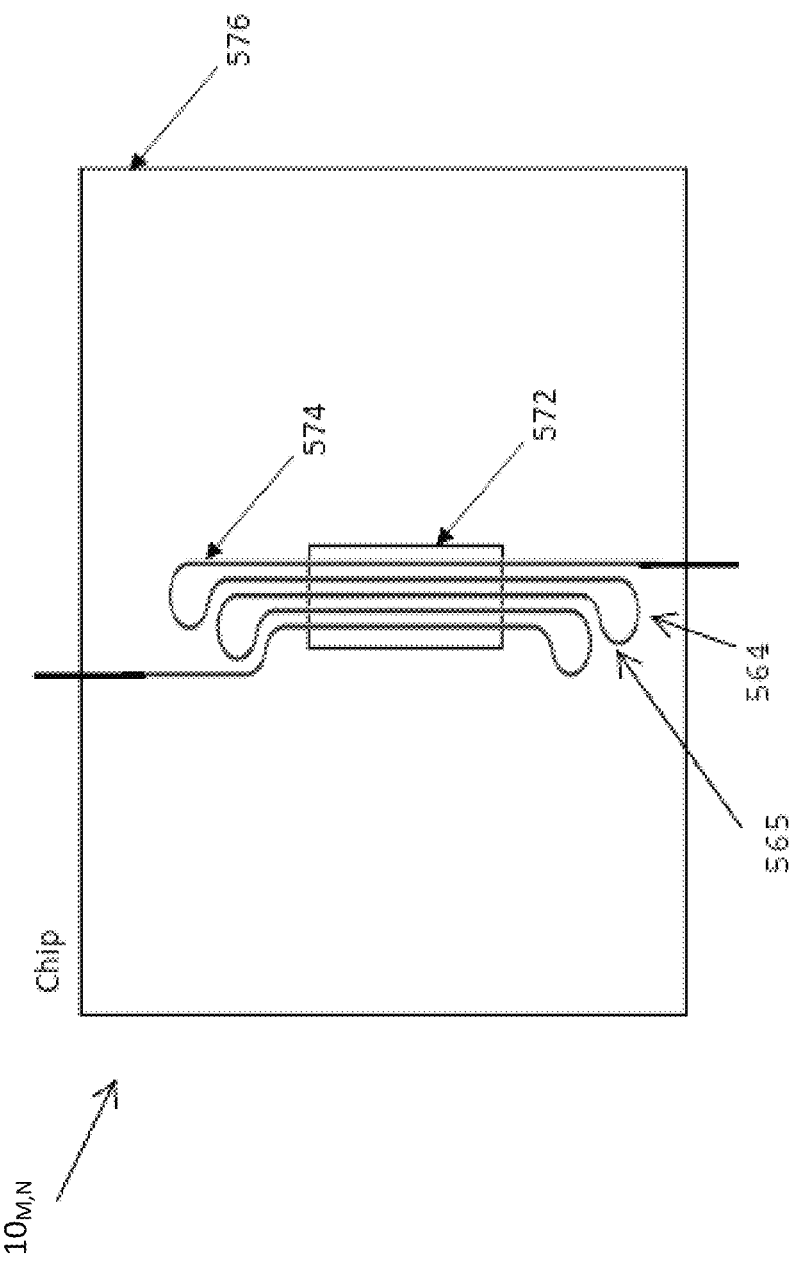
FIG. 13 is a top view of an exemplary optical waveguide arrangement of the multi-pass optical waveguide phase shifter.

FIGS. 12 and 13 illustrate a phase shifter $10_{M,N}$ including a waveguide 574, which includes a plurality of straight parallel waveguide sections, e.g. five waveguide sections 552, 554, 556, 558, and 560, with a bend section that enables a waveguide pitch in the active heater region far below the minimum bend radius, e.g. less than 800 nm, enabling the five waveguide sections 552, 554, 556, 558, and 560 to be placed tightly together. The bend sections may comprise a first bend traversing at least 180° followed by one or more second bends including portions bending in an opposite direction to the first bend. For example, each bend section may comprise a larger-radius, e.g. 180°, circular bend 564, e.g. bend radius greater than 1 μm, combined with an S-curve 565 to restore the narrow waveguide pitch, e.g. below 800 nm. The S-curve may comprise a concave portion extending from the 180° bend, and a concave portion extending between the concave portion and the next waveguide section. The bends sections may be nested, e.g. non adjacent each other due to the lengths of the waveguide sections 552, 554, 556, 558, and 560, being different, whereby portions of each of the 180° bends 564, may be disposed in a nested configuration, e.g. partially parallel, with portions of each of the adjacent S-curves 565, e.g. the concave portion, so the total width of the phase shifter 550 is not much larger than twice the bend radius, e.g. 2 μm, which is important to lower the total chip area consumed by the phase shifter 550. The bends 564 may include circular, semicircular, FIG. 12, or elliptical, FIG. 13, portions. In other words, the larger-radius 180° bends are used to route the long, straight parallel sections of the waveguide sections 552, 554, 556, 558, and 560 as closely together as possible. The combination of large-radius 180° bends 564 and S-curves 565 in this arrangement, when further combined with varying waveguide widths, enables the waveguide sections 552, 554, 556, 558, and 560 to be placed closer together than previously allowed for. FIG. 13 illustrates the bend plus S-curve routing scheme shown in FIG. 12 in the context of a chip, and a portion of the serpentine waveguide 574 running under a heater 572 within a chip 576.

Another embodiment of the phase shifter 550 includes bends 564 comprising a local bend radius that changes gradually and smoothly, i.e. adiabatically, along the propagation length of the bend 564. This may be done in such a way so that the minimum local bend radius is never less than a predetermined chosen value $r_{min}$. A typical value for $r_{min}$ is 2 μm, so as to minimize radiative bend loss in the waveguide 574. Using this smoothly changing technique, the bend 564 may be extended in a concave bend over an angle (180+x) degrees, then continued in a convex bend over an angle (−x) degrees, such that the waveguide exiting the bend 564 is parallel to the one entering the bend 564 but offset by the waveguide to waveguide distance underneath the heater 572. The transition from concave to convex bend particularly depends on the smooth change of local bend radius to minimize optical loss. The local bend radius R as a function of propagation length L can follow a number of forms, e.g. linear (R∝mL) or hyperbolic tangent (R∝tanh(L)). Additionally, the section of waveguide before or after the large-radius bend is typically tapered in width from the width of the preceding waveguide to the width of the following waveguide, such that waveguide width is held constant within the bend 564. Conventional phase shifters rely strictly on a very small bend radii to pack waveguides densely under a heater, and since the waveguides all use the same cross sections there is a limit on how tightly the waveguides can be packed together. In other words, those waveguides suffer from the problem of large minimum bend radius and large minimum waveguide-to-waveguide spacing. In comparison, embodiments of the present disclosure, such as thermal phase shifters 550, do not have these problems because they allow for even tighter packing of the waveguides, e.g. less than 800 nm, preferably less than 700 nm, waveguide-to-waveguide pitch versus perhaps 2 um with most methods without requiring tight bends.

Since the serpentine phase shifters $10_{M,N}$ make multiple passes through the heated zone of the chip but the escape waveguides 8 make only a single pass, the escape waveguides 8 effectively receive less thermal crosstalk than they otherwise would, given thermal decay alone. Thus, the escape waveguides 8 may be placed closer to other serpentine phase shifters $10_{M,N}$ than the required distance between two serpentine phase shifters $10_{M,N}$. In other words, the spacing between a serpentine phase shifter $10_{M,N}$ and an escape waveguide 8 may be less than spacing between two serpentine phase shifters $10_{M,N}$ because the escape waveguides 8 are less sensitive to temperature change and thermal crosstalk. The allowable spacing decreases by the multiplication in efficiency given by making multiple tight passes (up to nearly 5× for a five-pass phase shifter $10_{M,N}$, for example). Routing some number of escape waveguides 8 between each phase shifter $10_{M,N}$ therefore does not increase the area of the array. Accordingly, each escape waveguide 8 may be routed between neighboring phase shifters $10_{M,N}$ disposed in front of and behind each row of phase shifters $10_{M,N}$, whereby the escape waveguides 8 are disposed closer to one another than to the neighboring phase shifters $10_{M,N}$.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An optical phased array device comprising:
   an array of optical phase shifters comprising a plurality of rows of optical phase shifters, and a plurality of columns of optical phase shifters;
   a plurality of digital to analog converters (DACs), each one of the plurality of DACs configured to output an independent voltage or current onto one of the plurality of rows of optical phase shifters;
   a plurality of ground buses, each one of the plurality of ground buses configured to connect one of the plurality of columns of optical phase shifters to a common ground;
   a multiplexer configured to selectively connect one of the plurality of ground buses to the common ground, while disconnecting others of the plurality of ground buses;
   a processor; and
   a non-transitory memory for storing instructions, which when for executed by the processor:
      sequentially selects a different one of the plurality of columns of optical phase shifters to connect to the common ground, while disconnecting any other of the plurality of ground buses; and
      updates the voltage or current for each of the plurality of DACs based on which one of the plurality of columns of optical phase shifters has been selected.

2. The device according to claim 1, wherein each optical phase shifter in the array of optical phase shifters comprises:
   an optical waveguide; and
   a heater for heating the optical waveguide, thereby changing an index of refraction thereof.

3. The device according to claim 2, wherein each anode of each heater in a same row of the plurality of rows of optical phase shifters are connected to a common DAC; and
   wherein each cathode of each heater in a same column of the plurality of columns of optical phase shifters are connected to a respective one of the plurality of ground buses.

4. The device according to claim 2, wherein each heater in each optical phase shifter in the array of optical phase shifters is in series with a respective diode configured to prevent current from flowing to other optical phase shifters in a same row of optical phase shifters.

5. The device according to claim 4, wherein each respective diode has an absolute reverse breakdown voltage larger than a maximum drive voltage of each of the plurality of DACs.

6. The device according to claim 4, wherein each respective diode is integrated with one of the thermal phase shifters on a same chip.

7. The device according to claim 6, wherein each diode is selected from the group consisting of silicon PN diodes, silicon PIN diodes, Schottky diodes, and germanium diodes.

8. The device according to claim 2, wherein each heater comprises a resistive material selected from the group consisting of titanium nitride, nichrome, heavily doped silicon, silicide, titanium, and tungsten.

9. The device according to claim 1, wherein the multiplexer comprise a plurality of electrical switches, each one of the plurality of electrical switches configured to selectively connect one of the plurality of ground buses to the common ground.

10. The device according to claim 9, wherein each electrical switch comprises an N-type field effect transistor configure to provide a low-resistance path to ground, and a low built-in voltage across each electrical switch, thereby enabling each of the plurality of ground-buses to remain at a lower voltage relative to each one of the plurality of DACs.

11. The device according to claim 2, wherein the optical waveguide comprises a plurality of parallel waveguide sections adjacent each other in a waveguide layer of a photonic integrated circuit, and a plurality of waveguide bend sections connecting the plurality of parallel waveguide sections.

12. The device according to claim 11, wherein the optical waveguide is comprised of an optical waveguide material, and each heater is comprised of the waveguide material in the waveguide layer, and doped with P and/or N type material.

13. The device according to claim 12, wherein each heater in each optical phase shifter in the array of optical phase shifters is in series with a respective diode configured to prevent current from flowing to other optical phase shifters in a same row of optical phase shifters; and
   wherein each respective diode comprises a PN junction integrated with each heater.

14. The device according to claim 11, wherein adjacent parallel waveguide sections each having a different propagation constant, to exhibit a wavevector mismatch between immediately adjacent straight parallel waveguide sections to attenuate coupling therebetween.

15. The device according to claim 14, wherein each of the plurality of parallel waveguide sections comprises a different width.

16. The device according to claim 11, wherein the plurality of waveguide bend sections includes a first bend section and a last bend section including a larger bend radius, and a second bend section and a third bend section include a smaller bend radius.

17. The device according to claim 16, wherein the smaller bend radius is equal to half a waveguide pitch of the plurality of parallel waveguide sections, and the larger bend radius is at least 3 times larger than the smaller bend radius.

18. The device according to claim 11, wherein each of the plurality of waveguide bend sections comprises a first bend traversing at least 180° followed by a second bend including portions bending in an opposite direction to the first bend.

19. The device according to claim 18, wherein each first bend comprises a 180° circular bend and each second bend comprises an S-shaped bend.

20. The device according to claim 19, wherein each of the first bends and each of the second bends comprises a local bend radius that gradually changes; and wherein the local bend radius is never below a predetermined minimum value.

21. The device according to claim 18, wherein each of the plurality of parallel waveguide sections comprise a different length, whereby the plurality of waveguide bend sections are disposed in staggered, non-adjacent positions.

22. The device according to claim 21, wherein a portion of each of the first bends is parallel to a parallel portion of each of the second bends in adjacent waveguide bend sections.

* * * * *